US012800915B2

(12) United States Patent
Aboketaf et al.

(10) Patent No.: US 12,800,915 B2
(45) Date of Patent: Nov. 17, 2026

(54) SIGNAL PROPAGATION SIMULATION TOOL INCLUDING VIRTUAL OPTICAL PROBING AND/OR BIDIRECTIONAL SIMULATION

(71) Applicant: GlobalFoundries U.S. Inc., Malta, NY (US)

(72) Inventors: Abdelsalam Aboketaf, Clifton Park, NY (US); Frederick G. Anderson, South Burlington, VT (US); Yusheng Bian, Ballston Lake, NY (US); Petar I Todorov, Sofia (BG); Bradley A. Orner, Ben Lomond, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 774 days.

(21) Appl. No.: 18/325,233

(22) Filed: May 30, 2023

(65) Prior Publication Data

US 2024/0402486 A1 Dec. 5, 2024

(51) Int. Cl.
*G02B 27/00* (2006.01)
*G02B 6/12* (2006.01)
(Continued)

(52) U.S. Cl.
CPC ........... *G02B 27/0012* (2013.01); *G02B 6/12* (2013.01); *G06F 30/31* (2020.01); *G06F 30/323* (2020.01)

(58) Field of Classification Search
CPC ... G06F 30/323; G06F 30/31; G02B 27/0012; G02B 6/12
(Continued)

(56) References Cited

U.S. PATENT DOCUMENTS 10,503,865 B2 12/2019 Alloatti
11,635,616 B2 * 4/2023 Pond ....................... G06F 30/20 703/14
(Continued)

OTHER PUBLICATIONS

Aboketaf et al., "Towards fully automated testing and characterization for photonic compact modeling on 300-mm wafer platform," Optical Fiber Communication Conference (OFC) 2021, IEEE, 3 pages.
(Continued)

*Primary Examiner* — Suchin Parihar
(74) *Attorney, Agent, or Firm* — Francois Pagette; Hoffman Warnick LLC

(57) ABSTRACT

Systems and methods for designing photonic integrated circuits (PICs) include a simulation program with virtual optical probing functions and, optionally, bidirectional optical signal propagation simulation. For probing, a processor receives an output expression specifying a virtual optical probing function (e.g., for power in dBm, etc.) and a net within a PIC design. If different simulation types are enabled, the expression specifies simulation type. If bidirectionality is enabled, the expression specifies the forward or reverse direction. In response, the processor accesses the PIC design and results of simulation(s) thereof and calculates and outputs an optical signal parameter value for the specified net. For bidirectionality, component descriptions of photonic device cells define, at each input/output terminal, pins associated with each of multiple optical signal components in both directions and, when such cells are incorporated into a PIC design, analytical functions employ the pins to model the optical signal components in both directions.

20 Claims, 16 Drawing Sheets

(51) Int. Cl.
*G06F 30/31* (2020.01)
*G06F 30/323* (2020.01)

(58) Field of Classification Search
USPC .......................................................... 716/102
See application file for complete search history.

(56) References Cited

U.S. PATENT DOCUMENTS

| | | | | |
|---|---|---|---|---|
| 12,541,097 | B2 * | 2/2026 | Stoffer | G02B 27/0012 |
| 2017/0192408 | A1 * | 7/2017 | Nazarathy | G05B 13/04 |
| 2019/0018919 | A1 * | 1/2019 | Huang | G06F 30/30 |
| 2020/0326534 | A1 * | 10/2020 | Pond | H04B 10/2589 |
| 2020/0356085 | A1 * | 11/2020 | Wentz | H04L 9/0866 |
| 2023/0083003 | A1 * | 3/2023 | Stoffer | G02B 27/0012 716/126 |

OTHER PUBLICATIONS

Bian et al., "Monolithically integrated silicon nitride platform," Optical Fiber Communication Conference (OFC) 2021, 3 pages.
Bian et al., "Towards low-loss monolithic silicon and nitride photonic building blocks in state-of-the-art 300mm CMOS foundry," Frontiers in Optics, Laser Science, OSA 2020, 2 pages.
Fahrenkopf et al., "The AIM Photonics MPW: A Highly Accessible Cutting Edge Technology for Rapid Prototyping of Photonic Integrated Circuits," IEEE Journal of Selected Topics in Quantum Electronics, vol. 25, No. 5, Sep./Oct. 2019, 6 pages.
Giewont et al., "300-mm Monolithic Silicon Photonics Foundry Technology," IEEE Journal of Selected Topics in Quantum Electronics, vol. 25, No. 5, Sep./Oct. 2019, 11 pages.
Rakwoski et al., "45nm CMOS—Silicon Photonics Monolithic Technology (45CLO) for next-generation, low power and high speed optical interconnects," Optical Fiber Communication Conference (OFC) 2020, 3 pages.
Ahmed, "Sudip Shekhar, Cadence Virtuoso—Schematic & Simulations—Inverter (45nm)," Sep. 2015, retrieved from: https://sudip.ece.ubc.ca/cadence-virtuoso-schematic-simulations/ on Mar. 7, 2023, 9 pages.
Anonymous, "Ansys / optics: Verilog-A PAM4 Transceiver—Cadence Interoperability," retrieved from: https://optics.ansys.com/hc/en-US/articles/360042910313-Verilog-A-PAM4-Transceiver-Cadence-Interoperability on Mar. 7, 2023, 10 pages.
Montiel et al., "Modeling in Verilog-AMS of a front-end for the design of a multichannel readout ASIC for Si microstrips," 2012 International Conference on Synthesis, Modeling, Analysis and Simulation Methods and Applications to Circuit Design (SMACD), downloaded on Mar. 15, 2023 from IEEE Xplore, 4 pages.
Anonymous, "How to implement a continuously scanning multichannel system in Verilog," retrieved from: https://electronics.stackexchange.com/questions/558959/how-to-implement-a-continuously-scanning-multi-channel-system-in-verilog, Apr. 7, 2021, 4 pages.
Wu et al., "Compact Modeling and Circuit-Level Simulation of Silicon Nanophotonic Interconnects," Design, Automation and Test in Europe, IEEE 2017, pp. 602-605.
Ye et al., "SPICE-Compatible Equivalent Circuit Models for Accurate Time-Domain Simulations of Passive Photonic Integrated Circuits," Journal of Lightwave Technology, vol. 40, No. 24, Dec. 15, 2022, pp. 7856-7868.

* cited by examiner

SIGNAL PROPAGATION SIMULATION TOOL INCLUDING VIRTUAL OPTICAL PROBING AND/OR BIDIRECTIONAL SIMULATION

BACKGROUND

The present disclosure relates to photonic integrated circuit (PIC) design and, more particularly, to systems and methods that include an optical signal propagation simulation tool for use in PIC design.

During conventional integrated circuit (IC) design, netlists are extracted from a chip design layout and electrical simulations of the IC are performed (e.g., by a conventional simulation tool, such as a simulation program with integrated circuit emphasis (SPICE) tool) using the extracted netlists. If the performance models indicate that the chips will perform as required by the design specifications, the chip design layout will be verified and can be released for manufacturing. If not, the chip design layout will not be verified, and further iterative chip design processing will be required. With advances in technology, integrated circuit (IC) designs often incorporate photonic devices. Such photonic devices can include, but are not limited to, waveguides, laser diodes, light-emitting diodes, optical couplers, optical splitters, optical amplifiers, photodetectors (also referred to herein as photosensors), bends, polarization beam splitter and rotators (PSRs), optical modulators, and optical filters. ICs that include photonic devices are referred to as PICs. To accurately model PIC performance, simulations must account for electric and optical signals. Recently, simulation tools have been developed for use in PIC design and, particularly, for simulating optical signal propagation therein. However, such simulation tools have limited functionality.

SUMMARY

Disclosed herein are embodiments of a system for designing a PIC. The system can include an interface device (e.g., a monitor that displays a graphic user interface (GUI) for an optical signal propagation simulation program). The interface device can receive an output expression that at least specifies a virtual optical probing function of multiple virtual optical probing functions in the program and a net in a netlist for a PIC under design. The system can further include a processor, which is in communication with the interface device. In response to the output expression, the processor can access a storage medium that stores the netlist as well as the results of at least one previously performed simulation of the PIC under design. The processor can further execute the virtual optical probing function to calculate and output an optical signal parameter value for the net. The optical signal parameter value can specifically be calculated by the processor based on the results of the simulation(s) and can further be output by the processor, for example, via the GUI displayed on the interface device.

Also disclosed herein are embodiments of a method for designing a PIC. The method can include receiving an output expression. The output expression can, for example, be received from a user (e.g., from a PIC designer) via an interface device (e.g., via a monitor that displays a GUI for an optical signal propagation simulation program) and can at least specify a virtual optical probing function of multiple virtual optical probing functions in the program and a net in a netlist for a PIC under design. The method can further include accessing, by a processor in response to the output expression, a storage medium that stores the netlist as well as results of at least one previously performed simulation of the PIC under design. The method can further include executing, by the processor, the virtual optical probing function to calculate and output an optical signal parameter value for the net. The optical signal parameter value can specifically be calculated based on the results of the simulation(s) and output, for example, via the GUI displayed on the interface device.

Also disclosed herein are embodiments of a product. The product can include a computer readable storage medium, which has program instructions embodied therewith. These program instructions can be executable by a processor to cause the processor to perform the above-described method.

BRIEF DESCRIPTION OF THE DRAWINGS

The present disclosure will be better understood from the following detailed description with reference to the drawings, which are not necessarily drawn to scale and in which.

DETAILED DESCRIPTION

As mentioned above, to accurately model PIC performance during PIC design, simulations must account for electric and optical signals. Recently, simulation tools have been developed for use in PIC design and, particularly, for simulating optical signal propagation therein. However, such simulation tools have limited functionality.

In view of the foregoing, disclosed herein are embodiments of a system and a method for designing PICs. The embodiments employ an optical signal propagation simulation program with improved functionality including virtual optical probing functions and, optionally, bidirectional optical signal propagation simulation (i.e., both forward and reverse optical signal propagation simulation). Such an optical signal propagation simulation program can be employed during PIC design to ensure that the PIC will perform as intended. In embodiments with virtual optical probing functions, a processor can receive an output expression (e.g., via a graphic user interface (GUI)). The output expression can specify one of multiple different optical probing functions (e.g., power in decibel-milliwatts (dBm), power in milliwatts (mW), amplitude in volts/meter (V/m), signal phase in degrees or signal phase in radians) and can further specify a net from a netlist extracted from a PIC design. If different types of simulation (e.g., transient and DC) are enabled, the output expression can specify simulation type. If bidirectional optical signal propagation simulation is enabled, the output expression can specify signal propagation direction (e.g., forward or reverse). In response to the output expression, the processor can access the PIC design and results of previously performed simulation(s) thereof and can execute the specified optical probing function to calculate and output a corresponding optical signal parameter value for the specified net. In embodiments where bidirectional optical signal propagation simulation is enabled, component descriptions of photonic device cells in a cell library (e.g., of PDK) can define, at each light signal input/output terminal, a total of ten pins: five associated with optical signal components (e.g., transverse electric (TE) mode, transverse magnetic (TM) mode, real, imaginary, and wavelength) in the forward direction; and five associated with these same optical signal components in the reverse direction. When such cells are selected from the library for incorporation into the PIC design, analytical functions in the simulation program can employ the pins to model the optical signal components in both directions. It should be noted that, in some embodiments, the disclosed optical signal propagation simulation program can be embodied on a computer readable storage medium of a computer program product or, alternatively, of a process design kit (PDK) product.

Figure 1:
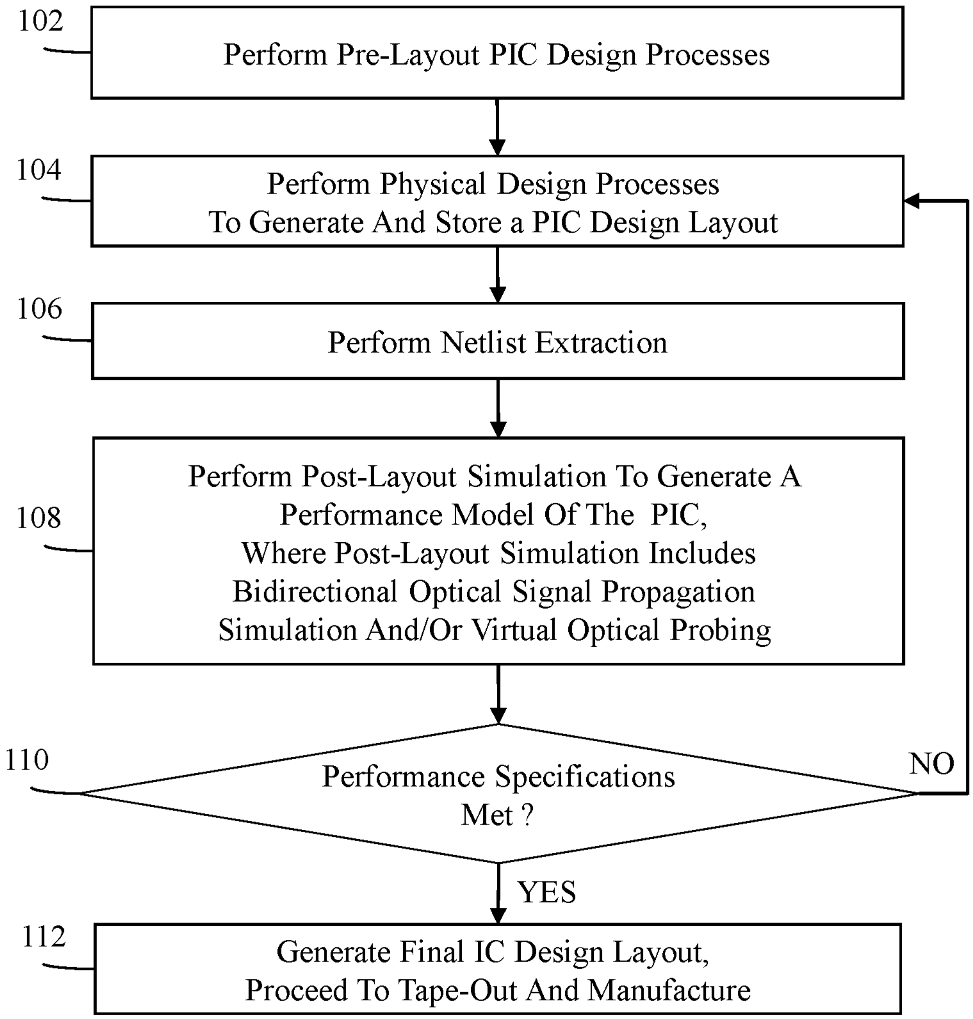
FIG. 1 is a flow diagram illustrating disclosed embodiments of a PIC design method.
Figure 2:
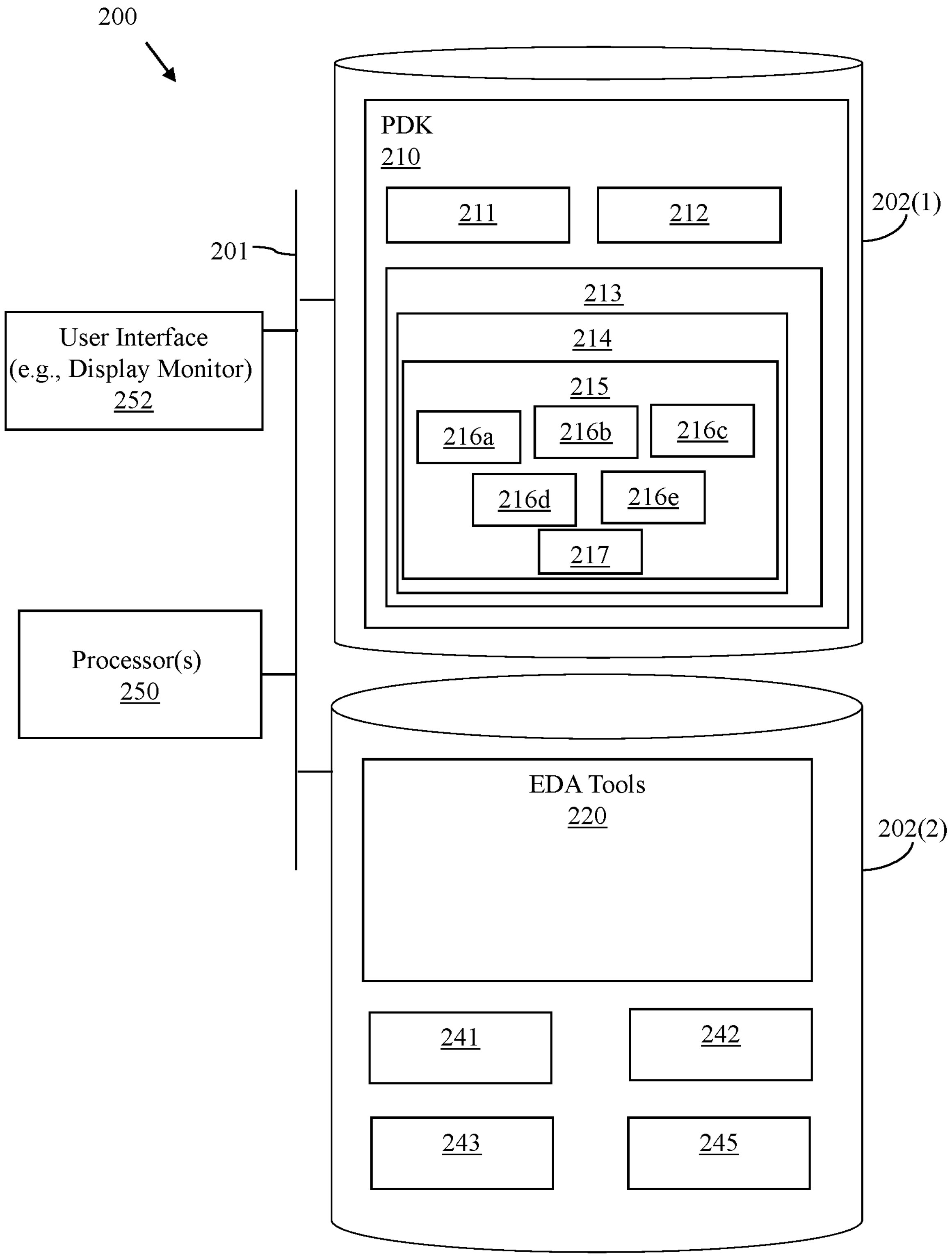
FIG. 2 is a schematic diagram illustrating disclosed embodiments of a PIC design system.

FIG. 1 is a flow diagram illustrating disclosed embodiments of a PIC design method that includes virtual optical probing and/or bidirectional optical signal propagation simulation. FIG. 2 is a schematic diagram illustrating disclosed embodiments of a computer-aided design (CAD) system 200, which can be employed to implement the disclosed PIC design method, and which is configured to perform virtual optical probing and/or bidirectional optical signal propagation simulations.

Referring to FIGS. 1 and 2 in combination, the disclosed method and system embodiments can be implemented using, for example, a process design kit (PDK) product. The PDK product can be in the form of a non-transitory computer readable storage medium having a PDK 210 embodied therewith (e.g., stored thereon). Those skilled in the art will recognize that a PDK 210 refers to a kit developed by a semiconductor foundry to facilitate design at a technology node supported by the foundry. For example, PDK 210 could be developed for a 300 mm silicon platform, which allows for integration of both silicon photonic (SiPh) devices and radio frequency (RF) complementary metal oxide semiconductor (CMOS) devices in the same PIC chip. Alternatively, PDK 210 could be developed for any other platform suitable for PIC design.

PDK 210 can include electronic files for various PDK components. The components can include, but are not limited to, a library 211 of cells. The cells in library 211 can include standard cells and/or parameterized cells (Pcells) for electronic devices and photonic devices (including optoelectronic devices), which are selectable for inclusion in a PIC design. For purposes of this disclosure, a "standard cell" represents a circuit component (including one or more devices and the electrical and/or optical connections therebetween) with a fixed set of parameters, while a "parameterized cell" (also referred to in the art as a template cell) similarly represents a circuit component (including one or more devices and the electrical and/or optical connections therebetween) but with customizable parameters. Such cells are known in the art and, thus, the details thereof have been omitted from the specification in order to allow the readers to focus on the salient aspects of the disclosed embodiments. For purposes of this disclosure, photonic devices (including optoelectronic devices) refer to devices configured to create, manipulate, process, propagate, or detect light signals (i.e., optical signals). Such photonic devices include, but are not limited to, waveguides, laser diodes, light-emitting diodes, optical couplers, optical splitters, optical amplifiers, photodetectors (also referred to herein as photosensors), bends, PSRs, optical modulators, and optical filters. Such photonic devices are well known in the art and, thus, the details thereof have been omitted from this specification in order to allow the reader to focus on the salient aspects of the disclosed embodiments. In any case, each cell can include a component description (e.g., in a component description format (CDF)) that defines the parameters and attributes thereof.

PDK 210 can further include various design data files 212. Design data files 212 can include, but are not limited to, symbols and technology files for the specific technology node, design rule decks for various stages in the design process, etc. PDK 210 can also include program files 213 including one or more electronic design automation (EDA) tools. For example, EDA tools can include one or more simulation programs 214. As discussed in greater detail below, at least one of the simulation programs 214 can be an optical signal propagation simulation program 215, which includes a corresponding graphic user interface (GUI) 217 and which includes program instructions for virtual optical probing functions for forward optical signal propagation simulation and, optionally, for bidirectional optical signal propagation simulation (i.e., for both forward and reverse optical signal propagation simulation).

In practice, a PDK 210 product can be made accessible to foundry customers and, particularly, to CAD system(s) 200 thereof for use in conjunction with EDA tools 220. Specifically, a CAD system 200 can include one or more processors 250, one or more user interface devices 252 (e.g., monitors, displays, etc.), and one or more computer-readable storage mediums or devices (e.g., see storage mediums 202(1)-202(2)), which are accessible by the processor(s) 250. The various components of CAD system 200 can include, but are not limited to, the processor(s) 250, user interface device(s) 252, and storage mediums(s) 202(1)-202(2) interconnected either over a system bus 201, as illustrated, and/or over a wired or wireless network (not shown). The various components of CAD system 200 can be co-located. Alternatively, CAD system 200 can be a client-server system with a central server and multiple networked workstations. Alternatively, CAD system 200 can be a distributed system whose components are distributed across different networked computers. In any case, for purposes of illustration, CAD system 200 is illustrated in FIG. 2 as if it incorporates only a single processor 250, a single user interface device 252, and two storage mediums 202(1)-202(2). However, it should be understood that, alternatively, CAD system 200 can incorporate multiple processors 250 for performing one or more of the different steps in the design flow, as discussed below, multiple user interface devices 252, and any number of one or more storage mediums, which store the data and programs (i.e., software tools or applications) that are employed during the different steps in the design flow.

Storage medium 202(1) can store PDK 210. As mentioned above, the PDK 210 product can be in the form of a computer-readable storage medium having PDK 210 embodied therewith (e.g., stored thereon). Storage medium 202(1) can be the PDK product itself (e.g., a disk, flash drive, portable hard drive, etc.), which has PDK 210 stored thereon and which is accessible by a processor 250 of CAD system 200 through an interface (e.g., via a disk reader, USB port, or other interface, as appropriate). Alternatively, PDK 210 can be loaded onto storage medium 202(1) from PDK product through the interface.

Storage medium 202(2) can store additional EDA tools 220 (i.e., EDA software programs or applications) not otherwise provided by PDK 210. Examples of such EDA tools 220 can include, but are not limited to, a partitioning tool, a floorplanning tool, a placement tool, a clock tree synthesis tool, a signal routing tool, a timing closure tool, a netlist extraction tool, a layout versus schematic tool, a design rule checking tool, and one or more simulation tool(s). Based on user inputs (e.g., received via a user interface device 252) and based on information contained in PDK 210, the processor(s) 250 can execute such EDA tools 220 at different stages in the development of a PIC design and can store the results from each stage (e.g., in the storage medium 202(2)).

Generally, the disclosed method embodiments (as shown in FIG. 1) can be implemented using the disclosed system embodiments and, particularly, using the CAD system 200, including the PDK 210 (as shown in FIG. 2), as described below.

For example, the embodiments can include performing pre-layout design processes for a PIC (see process 102). The pre-layout design processes can be performed by processor 250 (executing one or more of the EDA tools 220) based on inputs received from a user via user interface 252. Such pre-layout design processes are well known in the art and, thus, the details thereof have been omitted from the specification to allow the reader to focus on the salient aspects of the disclosed embodiments. However, generally, such pre-layout design processes include, but are not limited to, developing an initial design for the PIC based on design and performance specification inputs and, particularly, developing a high-level description of the PIC coded in, for example, a hardware description language (HDL), such as Verilog HDL or any other suitable HDL; and synthesis of a gate-level netlist for the PIC. The netlist will contain cell information, interconnections, and other details.

Physical design processes can be performed to transform the PIC description into a physical layout and, particularly, to generate a design layout 241 for the PIC that describes the position of cells and interconnections therebetween (see process 104). The physical design processes can be performed by processor 250 (executing one or more of the EDA tools 220) based on inputs received from a user via user interface 252. Such physical design processes are well known in the art and, thus, the details thereof have been omitted from the specification in order to allow the reader to focus on the salient aspects of the disclosed embodiments. However, the physical design processes can include, but are not limited to the following: partitioning, floorplanning, placement, clock tree synthesis, signal routing, and timing closure. Those skilled in the art will further recognize that physical design processes are performed based on design rules. The design rules can be included in rule decks (e.g., provided in the PDK) for one or more of the particular processes in the design flow. In any case, the design layout 241 developed at process 104 can be stored in a storage medium (e.g., storage medium 202(2) accessible by the processor 250).

Following the physical design processes, netlist extraction can be performed, and the resulting post-layout netlist 242 can be stored (see process 106). That is, the design layout 241 can be translated back into a netlist to facilitate performing various other post-layout processes including, but not limited to, a layout versus schematic (LVS) and post-layout simulation (see discussion of post-layout simulation below). The post-layout netlist 242 can be extracted and stored at process 106 by processor 250 (executing a netlist extraction tool).

Post-layout simulation(s) (e.g., simulation program with integrated circuit emphasis (SPICE) simulations) can be performed using the post-layout netlist 242, the resulting simulation results 245 can be stored, and further output to a user (see process 108). Post-layout simulation(s) can be performed by the processor 250 executing one or more simulation tools and the simulation results 245 can be stored in storage medium 202(2) and further output to a user (either automatically or on-demand, as discussed further below). The simulation tool(s) executed by the processor 250 can at least include the optical signal propagation simulation program 215 for performance of optical signal propagation simulation including bidirectional optical signal propagation simulation and/or virtual optical probing.

The simulation results 245 can further be evaluated to determine whether or not performance specifications (e.g., requirements for optical signal propagation characteristics, such as power, amplitude, and/or signal phase, requirements for current-voltage (I-V) characteristics, etc.) for the PIC have been met or not (see process 110). Evaluation of the simulation results 245 can be performed manually by the user based on the output, automatically by the processor, and/or by a combination of both automatic and manual evaluation processes. In any case, if one or more of the performance specifications have not been met, processes 104-110 can be iteratively repeated adjusting the design layout 241 until such performance specifications have been met.

Once the performance specifications have been met, a final PIC design layout 243 can be stored and released to tape-out (e.g., in a binary database file format suitable for EDA data exchange on PIC layout artwork, such as in a graphic design system (GDS) format or GDS II format) (see process 112). Those skilled in the art will recognize that one or more other verification processes (e.g., timing and signal integrity verification, physical verification, electromigration fails and voltage drop verification, etc.) may, optionally, be performed before completing the final IC design layout. Once the final IC design layout 243 is completed, it can be released to manufacturing so that PIC chips can be manufactured accordingly.

The following is a discussion of the optional bidirectional optical signal propagation simulation feature of the disclosed embodiments. For purposes of this disclosure, bidirectional optical signal propagation refers to both forward propagation of an optical signal and reverse propagation (also referred to herein as reflected propagation) of the same optical signal. To implement bidirectional optical signal propagation simulation, the component descriptions (e.g., CDF) of the photonic device cells in the cell library 211 can include ten pins at each terminal of each component that either emits or receives light signals. Specifically, at any input terminal of a photonic device cell that receives light signals, ten optical signal input pins (In[0-9]) can be defined. Additionally, at any output terminal of a photonic device cell that emits light signals, ten optical signal output pins (Out [0-9]) can be defined. Five of the ten optical signal input pins can be designated for forward signal propagation and can include: In[0] associated with the transverse electric (TE)

mode and the real component, In[1] associated with the TE mode and the imaginary component, In[2] associated with the transverse magnetic (TM) mode and the real component, In[3] associated with the TM mode and the imaginary component, and In[4] associated with wavelength. Five of the ten optical signal input pins can be designated for reverse signal propagation and can similarly include: In[5] associated with the TE mode and the real component, In[6] associated with the TE mode and the imaginary component, In[7] associated with the TM mode and the real component, In[8] associated with the TM mode and the imaginary component, and In[9] associated with wavelength. Five of the ten optical signal output pins can be designated for forward signal propagation and can include: Out[0] associated with the TE mode and the real component, Out[1] associated with the TE mode and the imaginary component, Out[2] associated with the TM mode and the real component, Out[3] associated with the TM mode and the imaginary component, and Out[4] associated with wavelength. Five of the ten optical signal output pins can be designated for reverse signal propagation and can similarly include: Out[5] associated with the TE mode and the real component, Out[6] associated with the TE mode and the imaginary component, Out[7] associated with the TM mode and the real component, Out[8] associated with the TM mode and the imaginary component, and Out[9] associated with wavelength.

Figure 3A:
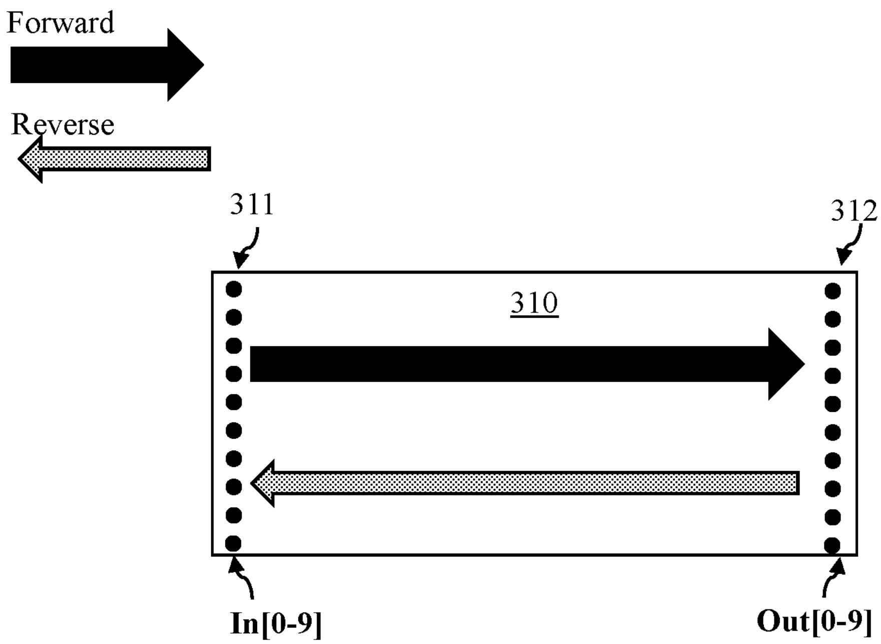
FIG. 3A is a layout diagram illustrating an example of a layout for a photonic device cell and FIGS. 3B and 3C illustrate input and output pins, respectively, that facilitate bidirectional optical signal propagation simulation through the cell.
Figure 3B:
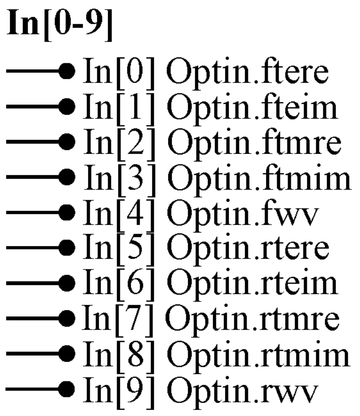
Figure 3C:
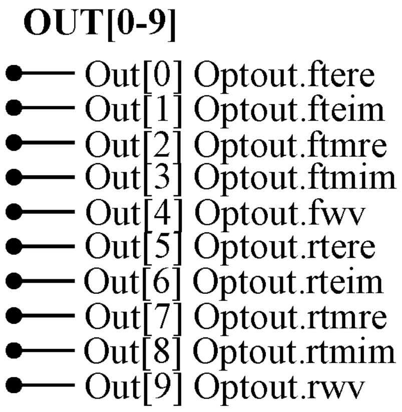

FIG. 3A illustrates an example of a cell for a photonic device and, particularly, a waveguide 310 with a light receiving terminal 311 having ten defined input pins (In[0-9]) (see FIG. 3B) and with a light emitting terminal 312 having ten defined output pins (Out[0-9]) (see FIG. 3C). It should be understood that cells of other types of photonic devices in the cell library would similarly include ten defined input pins (In[0-9]) at any input terminal thereof that receives optical signals and ten defined output pins (Out[0-9]) at any output terminal thereof that emits/outputs optical signals).

Figure 4:
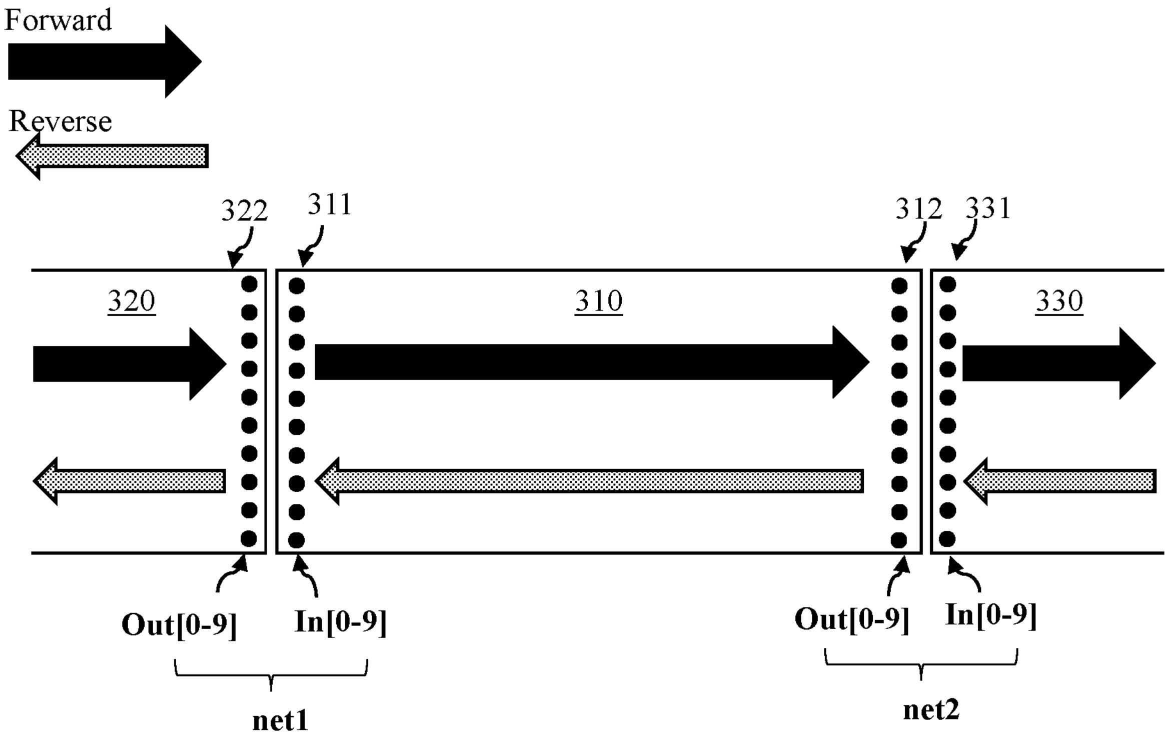
FIG. 4 is a layout diagram illustrating cell placement.

FIG. 4 illustrates an example of placement (e.g., using the cell placement tool in the CAD system 200 of FIG. 2) of the cell for the waveguide 310 between two additional cells for two additional photonic devices 320 (e.g., a light emitting device) and 330 (e.g., a light receiving device). For example, the cell for the waveguide 310 could be placed so that the light receiving terminal 311 thereof is optically coupled to a light emitting terminal 322 of an additional cell for a photonic device 320 (e.g., a light source or light emitting device), which has, at its light emitting terminal 322, ten defined output pins (Out[0-9]). The cell for the waveguide 310 can further be placed so that the light emitting terminal 312 thereof is optically coupled to a light receiving terminal 331 of an additional cell for an additional photonic device 330 (e.g., a light receiving device, such as a photodetector, another waveguide, a coupler, a splitter, a modulator, etc.), which has, at its light receiving terminal 331, ten defined input pins (In[0-9]). It should be noted that, during netlist extraction, the post-layout netlist 242 can include a first extracted net (net1), which represents the optical coupling between devices 310 and 320 and a second extracted net (net2), which represents the optical coupling between devices 310 and 330.

Figure 5:
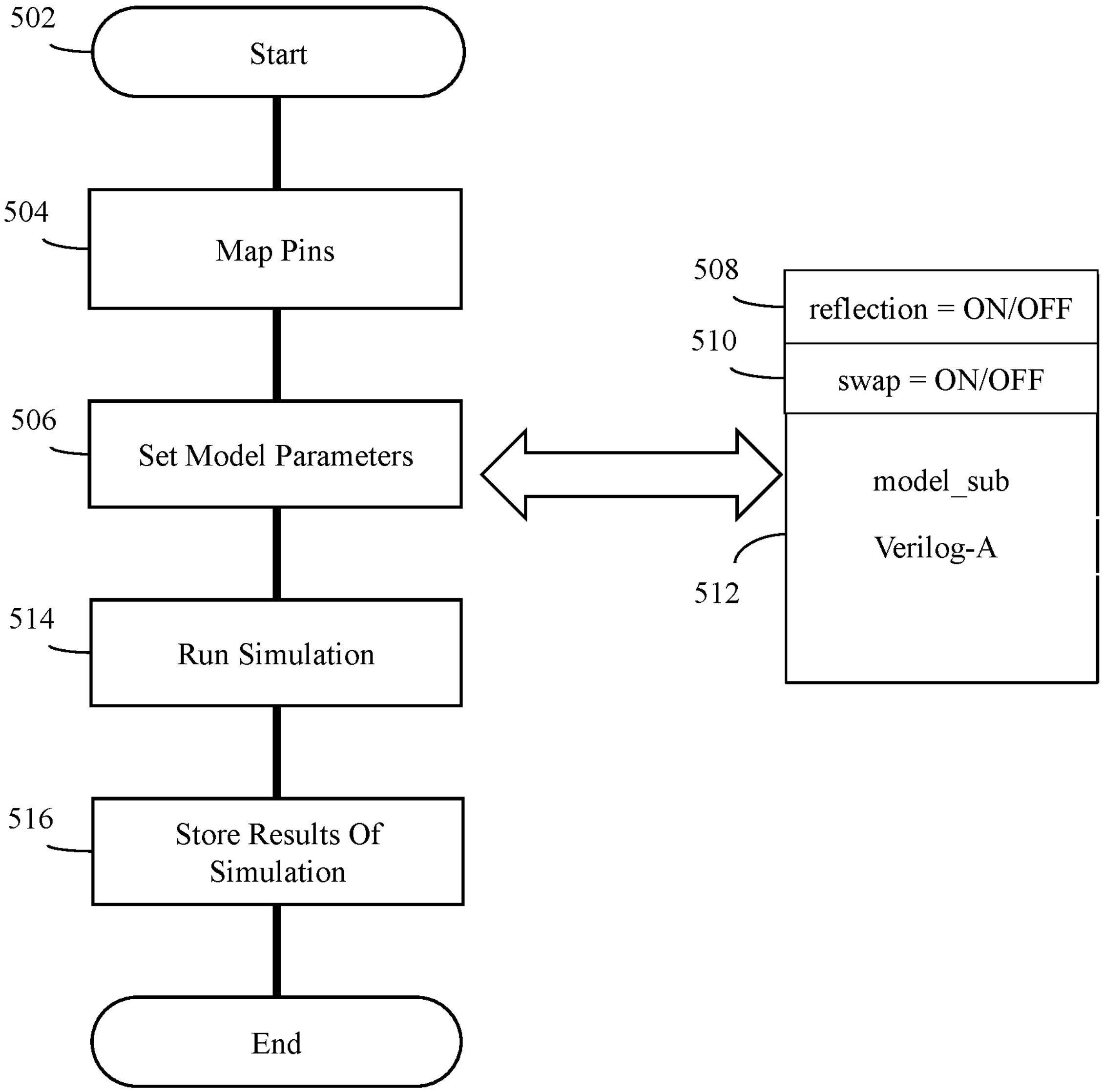
FIG. 5 is a flow diagram illustrating optical signal propagation simulation.
Figure 6:
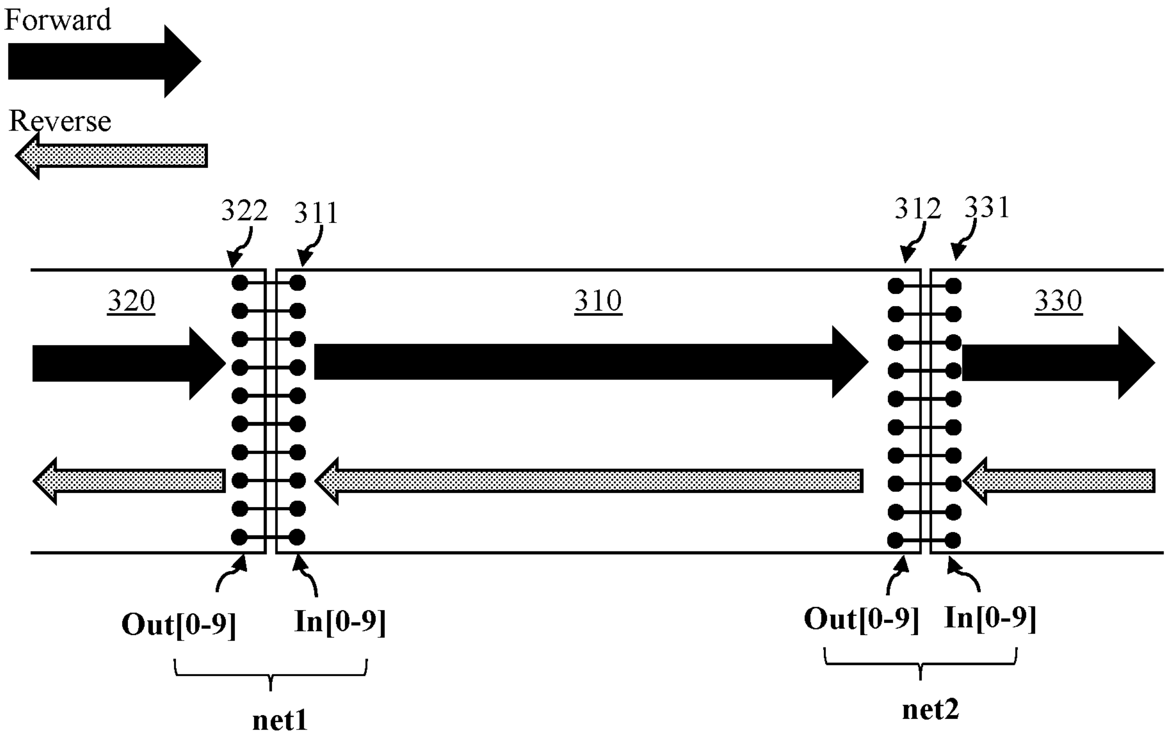
FIG. 6 is a layout diagram illustrating pin mapping.

FIG. 5 is a flow diagram illustrating more specifically optical signal propagation simulation, including forward optical signal propagation and, optionally, reverse optical signal propagation, through the waveguide 310 as placed in FIG. 4 and using the optical signal propagation simulation program 215, which is executable by the processor 250 of CAD system 200 of FIG. 2. Following initiation of a simulation operation at process 502, pin mapping can be performed to map corresponding input and output pins of optically coupled photonic devices (see process 504). In this case, the ten defined output pins (Out[0-9]) of photonic device 320 can be mapped to and, particularly, paired with the ten defined input pins (In[0-9]), respectively, of the waveguide 310, the ten defined output pins (Out[0-9]) of the waveguide 310 can be mapped to and, particularly, paired with the ten defined input pins (In[0-9]), respectively, of the photonic device 330, and so on (e.g., see FIG. 6). Thus, following the pin mapping at process 504, mapped input/output pin pairs for each of net1 and net2 include: for forward signal propagation, a pair of pins for the TE mode and real component, a pair of pins for the TE mode and imaginary component, a pair of pins for the TM mode and real component, a pair of pins for the TM mode and imaginary component, and a pair of pins for wavelength; and, similarly, for reverse signal propagation, a pair of pins for the TE mode and real component, a pair of pins for the TE mode and imaginary component, a pair of pins for the TM mode and real component, a pair of pins for the TM mode and imaginary component, and a pair of pins for wavelength.

Figure 7A:
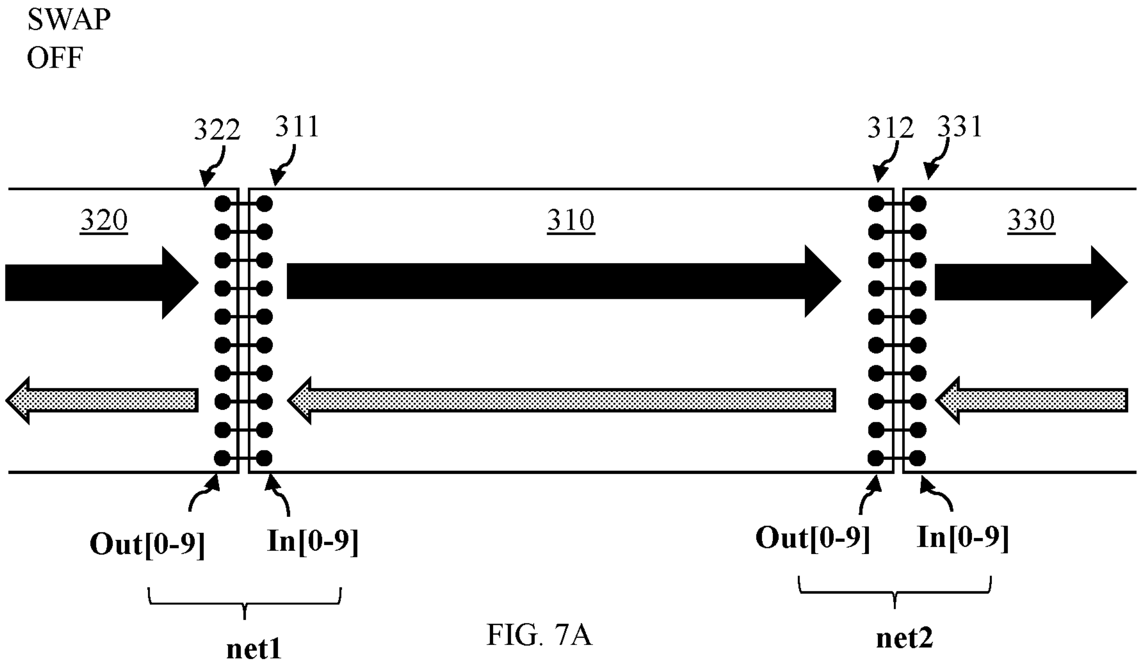
FIGS. 7A and 7B are layout diagrams illustrating swap OFF and swap ON functions, respectively.
Figure 7B:
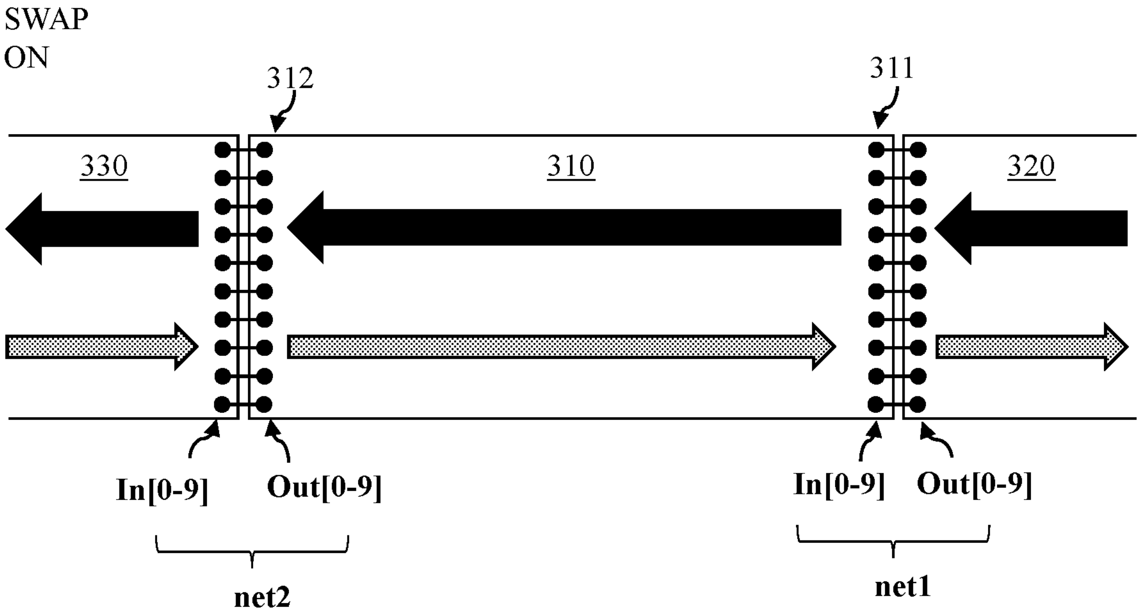

Following pin mapping, simulation model parameters can be set (e.g., selected, defined, etc.) (see process 506). The simulation model parameters can include, among other parameters, the type of simulation to be performed. The type of simulation can be, for example, a direct current (DC) analysis, alternating current (AC) analysis, transient analysis, Monte Carlo analysis, or any other type of analysis (e.g., an S parameter and Fourier analysis, a noise analysis, etc.). Such simulation types are known in the art and, thus, the details thereof have been omitted from this specification in order to allow the reader to focus on the salient aspects of the disclosed embodiments. Optionally, the simulation model parameters can also include an on/off selection field for reverse optical signal propagation simulation (see process 508). Optionally, the simulation model parameters can include an on/off selection field for a swap function (see process 510 and FIGS. 7A-7B). That is, simulation of signal propagation through waveguide 310 can be performed with the swap function turned off and, when the swap function is off, the optical signal propagation simulation is performed with the phonic devices 320 and 330 adjacent to opposite ends of the waveguide 310, as shown in the design layout and FIG. 7A. However, if the swap function is turned on, the positions of the photonic devices 320 and 330 at the opposite ends of the waveguide 310 will be swapped for simulation purposes, as shown in FIG. 7B. The simulation model parameters can also specify, for example, a sub-circuit model file that is being called by another higher-level model or circuit (see process 512). Once the simulation model parameters are set, the simulation can be run (see process 514) and the results 245 of the simulation can be stored (e.g., by processor 250 in storage medium 202(2)) (see process 516).

Figure 8:
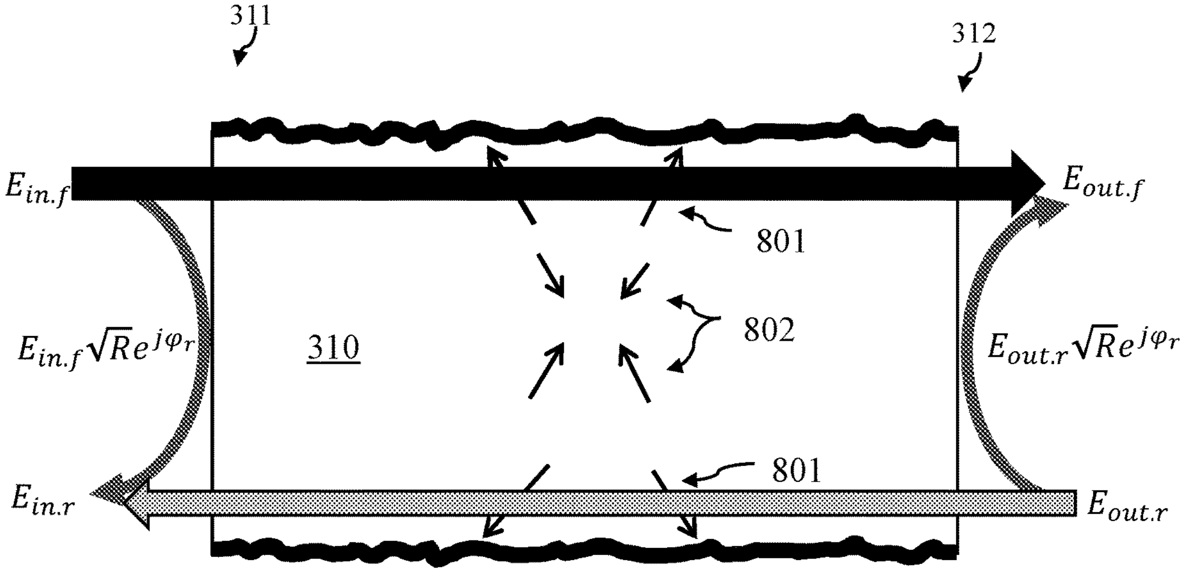
FIG. 8 is a model diagram illustrating forward and reverse optical signal propagation.

FIG. 8 is a diagram illustrating an analytical model that can be employed to simulate forward and reverse optical signal propagation through, for example, waveguide 310 (e.g., a waveguide) at process 514. As indicated, scattering loss 801 occurs at the external surfaces of the photonic device 310 and absorption loss 802 occurs within the photonic device 310. The analytical model represents the input electric field in the forward optical signal propagation direction ($E_{in,f}$) and reflection thereof ($E_{in,f}\sqrt{R}e^{j\varphi r}$) at the input end 311, the output electric field in the forward optical signal propagation direction ($E_{out,f}$) at the output end 312, the input electric field in the reverse optical signal propagation direction ($E_{in,f}r$) at the input end 311, and the output electric field in the reverse optical signal propagation direction ($E_{out,r}$) and the reflection thereof ($E_{out,r}\sqrt{R}e^{j\varphi r}$) at the output end 312 using the following equations:

$$\begin{bmatrix} E_{in.r}^{TE} \\ E_{in.r}^{TM} \\ E_{out.f}^{TE} \\ E_{out.f}^{TM} \end{bmatrix} = \begin{bmatrix} \sqrt{R_{TE}}\, e^{j\varphi_r TE} & 0 & \sqrt{T_{TE}}\, e^{j\varphi_t TE} & 0 \\ 0 & \sqrt{R_{TM}}\, e^{j\varphi_r TM} & 0 & \sqrt{T_{TM}}\, e^{j\varphi_t TM} \\ \sqrt{T_{TE}}\, e^{j\varphi_t TE} & 0 & \sqrt{R_{TE}}\, e^{j\varphi_r TE} & 0 \\ 0 & \sqrt{T_{TM}}\, e^{j\varphi_t TM} & 0 & \sqrt{R_{TM}}\, e^{j\varphi_r TM} \end{bmatrix} \begin{bmatrix} E_{in.f}^{TE} \\ E_{in.f}^{TM} \\ E_{out.r}^{TE} \\ E_{out.r}^{TM} \end{bmatrix}, \tag{1}$$

$$E_{in.r} = \sqrt{R}\, e^{j\varphi_r} * E_{in.f} + \sqrt{T}\, e^{j\varphi_t} * E_{out.r}, \text{ and} \tag{2}$$

$$E_{out.f} = \sqrt{T}\, e^{j\varphi_t} * E_{in.f} + \sqrt{R}\, e^{j\varphi_r} * E_{out.r}, \tag{3}$$

where E refers to an electric field, in refers to an input signal, out refers to an output signal, r refers to a reflected signal (or reverse signal propagation direction), f refers to forward signal propagation direction, TE refers to the transverse electric mode, TM refers to the transverse magnetic mode, R refers to a reflection coefficient, T refers to a transmission coefficient, R refers to a reflection coefficient, e refers to an exponential, j refers to a complex number (square root of −1), and φ refers to the signal phase.

Post-layout performance models generated at process 108 of FIG. 1 using forward and reverse optical signal propagation simulation available through the optical signal propagation simulation program 215 will indicate whether or not the PIC under design will perform as required following manufacturing (e.g., see process 110 of FIG. 1). If so, the PIC design can be verified and released to tape-out (see process 112 of FIG. 1). If not, the PIC design will not be verified, and further iterative PIC design processing will be required, as discussed above. In any case, performance models generated using both forward and reverse optical signal propagation simulation will more accurately reflect PIC performance as compared to performance models generated using only forward optical signal propagation simulation.

The following is a discussion of the virtual optical probing functions of the disclosed embodiments. For the purposes of this disclosure, optical probing refers to a process of acquiring (e.g., through sensing) a specific optical signal parameter value at a specific location in a manufactured PIC. Virtual optical probing refers to a technique for using the GUI 217 of the optical signal propagation simulation program 215 to allow users to request calculation of the same specific optical signal parameter value in a PIC design (e.g., at a specific net in the post-layout netlist 242) based on previously performed post-layout simulation results 245. In the disclosed embodiments, the specific optical signal parameter value can be, for example, power in decibel-milliwatts (dBm) of an optical signal on the net, power in milliwatts (mW) of an optical signal on the net, amplitude in volts/meter (V/m) of an optical signal on the net, signal phase in degrees of an optical signal on the net, and signal phase in radians of an optical signal on the net.

Figure 9:
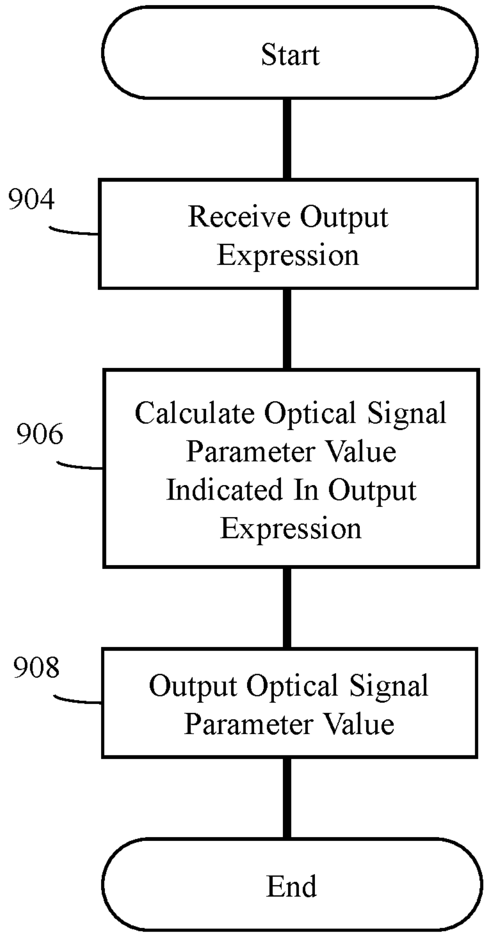
FIG. 9 is a flow diagram illustrating virtual optical signal probing.

FIG. 9 is a flow diagram illustrating more specifically virtual optical signal probing. Such virtual optical probing can be performed by process 250 executing the optical signal propagation simulation program 215 and based on inputs received from a user via the GUI 217 of the program 215 (e.g., displayed on user interface 252). Such virtual optical probing is an optional function that can be initiated by a user (e.g., via the GUI 217) following optical signal propagation simulation including forward signal propagation simulation and, optionally, including reverse signal propagation simulation (e.g., if bidirectional optical signal propagation simulation is enabled).

Virtual optical probing can include receiving an output expression that defines a specific virtual optical probing function to be performed (see process 904). The output expression can be received by processor 250 via GUI 217 of the optical signal propagation simulation program 215. For purposes of this disclosure, an output expression refers to text that specifically defines the optical signal parameter value to be calculated. In the disclosed embodiments, this output expression can at least indicate a specific net within the netlist 242 and one of multiple different optical probing functions 216*a*-216*e*. Such optical probing functions can include, but are not limited to, the following: a function for calculation of power in decibel-milliwatts (dBm) of an optical signal on the net (netTodBm) 216*a*, a function for calculation of power in milliwatts (mW) of an optical signal on the net (netTomW) 216*b*, a function for calculation of amplitude in volts/meter of the optical signal on the net (netToAmplitude) 216*c*, a function for calculation of signal phase in degrees of the optical signal on the net (netTodeg) 216*d*, and a function for calculation of signal phase in radians of the optical signal on the net (netTorad) 216*e*. Optionally, this optical expression can also specify an optical signal mode (e.g., either a TE mode or a TM mode) if the simulation program provides for more than one type of optical signal mode. Optionally, this optical expression can also specify a simulation type (e.g., DC simulation (dcOp), transient simulation (tOp), etc.) if the simulation program provides for more than one type of simulation. Optionally, the optical expression can also specify an optical signal propagation direction (e.g., forward signal propagation (f) or reverse signal propagation (r)) if bidirectional optical signal propagation simulation is enabled (e.g., as described above).

Figure 10:
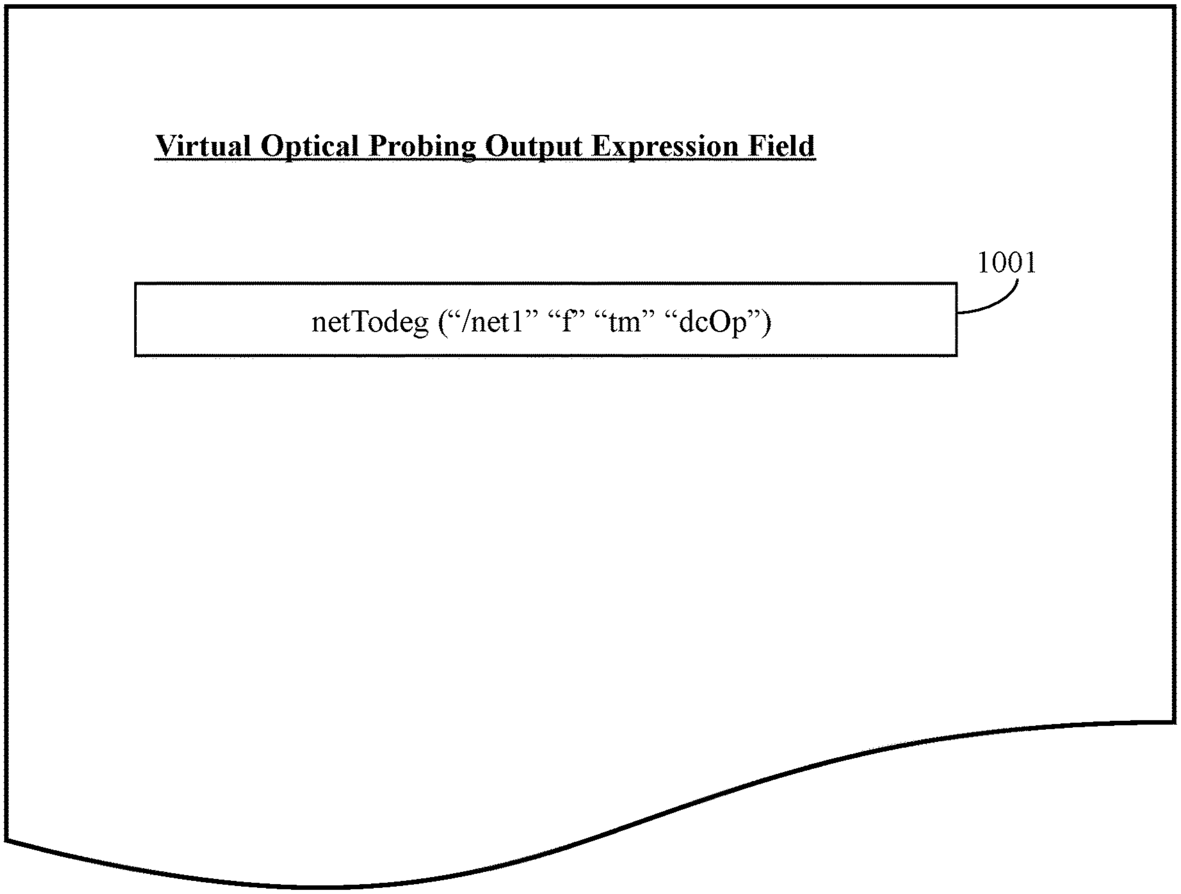
FIGS. 10-15 are examples of graphic user interface screen shots during virtual optical signal probing.
Figure 11:
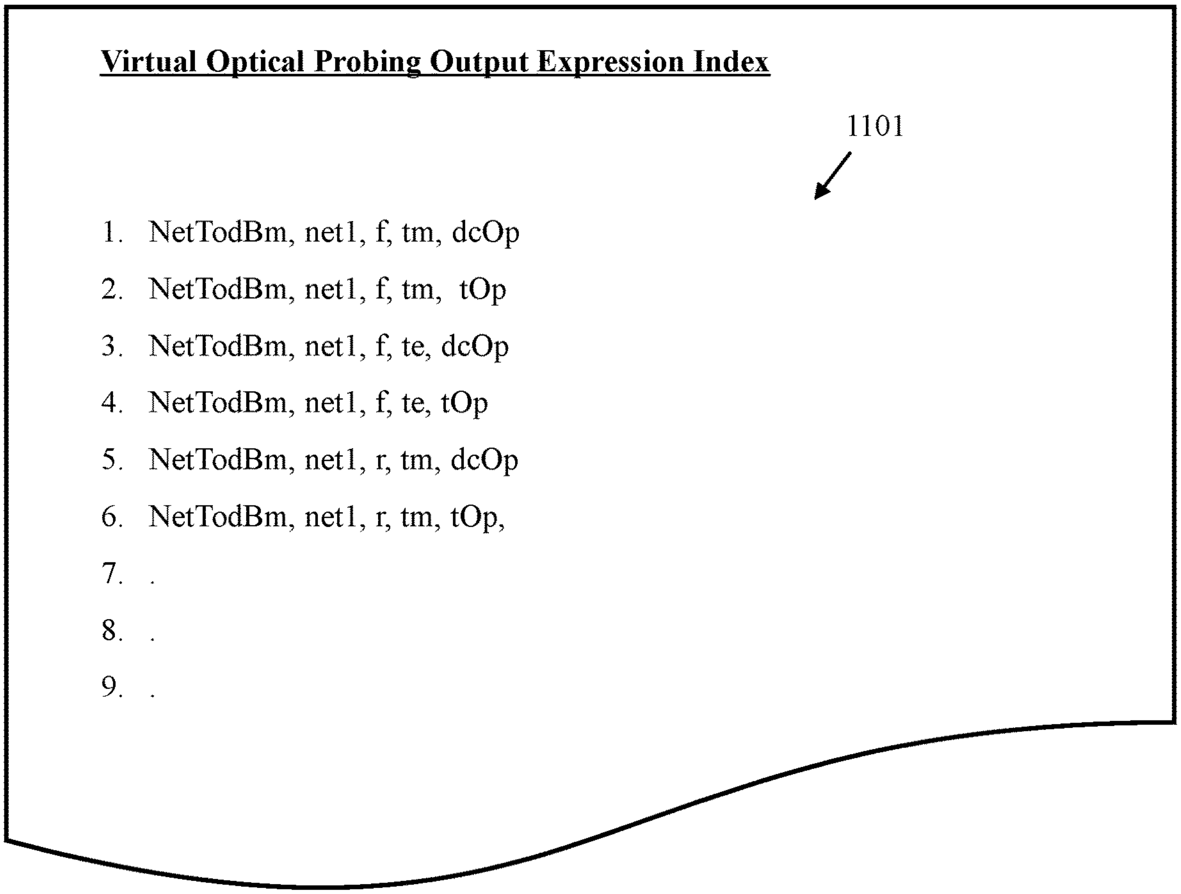
Figure 12:
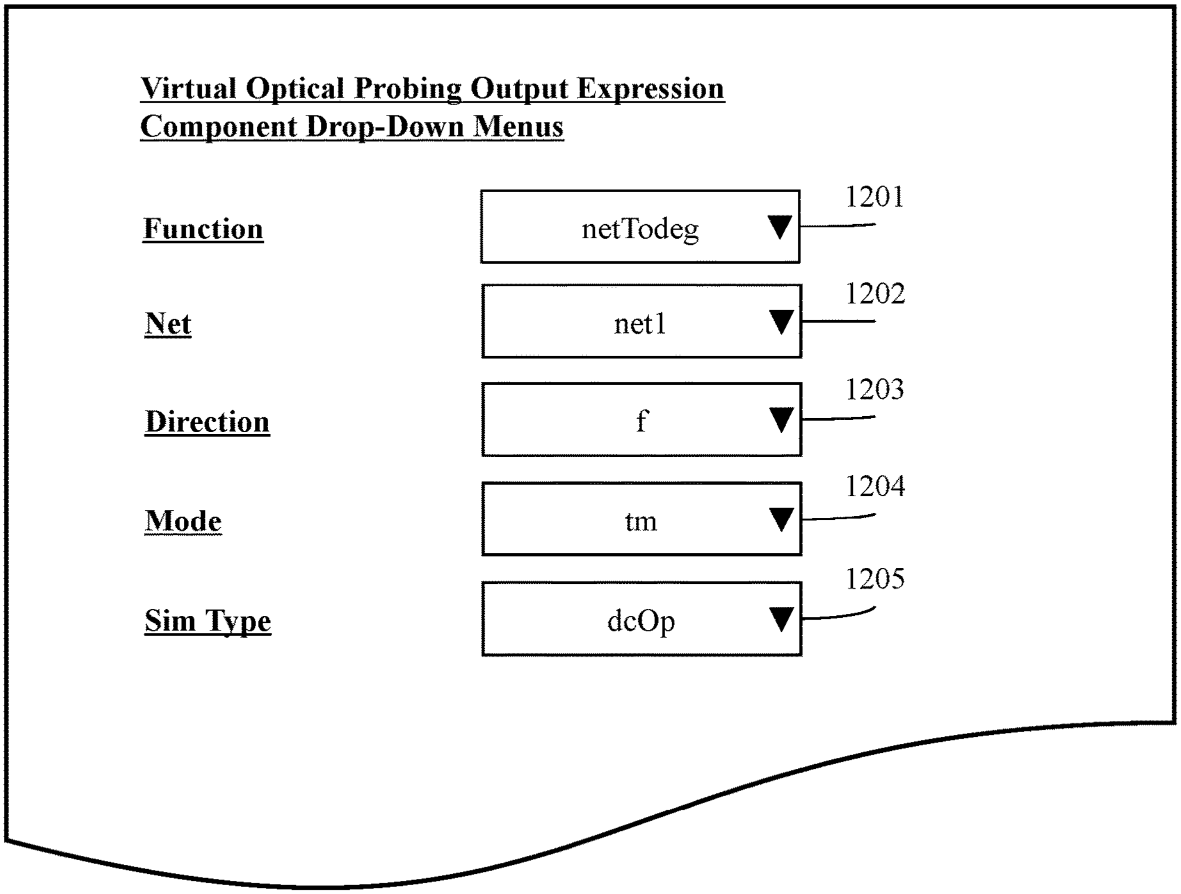
Figure 13:
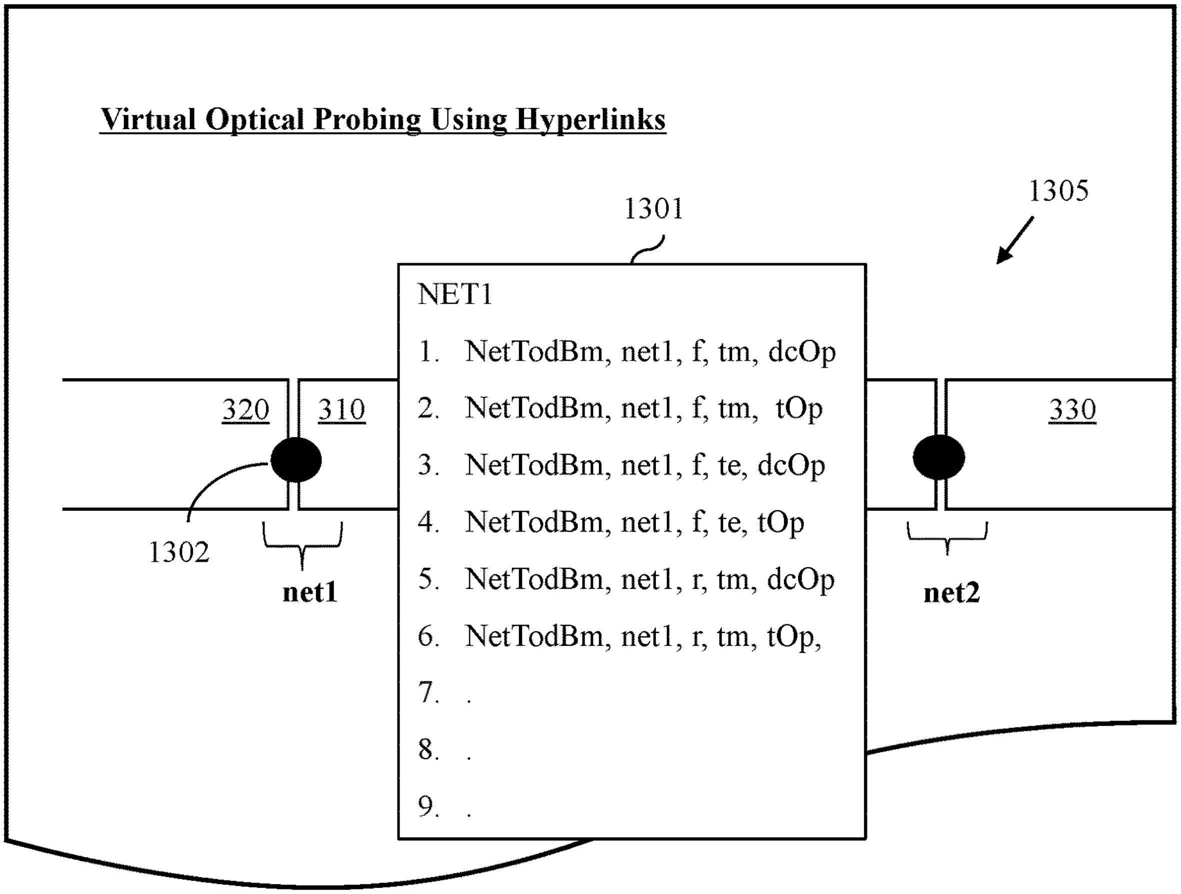

GUI 217 can provide a variety of different input options for receiving the output expression. Specifically, the output expression can be any of user-drafted, user-selected from a displayed index listing all output expressions, user-selected from displayed drop-down windows for each output expression component, user-selected from a displayed drop-down window following activation of net-specific hyperlink in a displayed circuit diagram, etc. More specifically, the output expression could, for example, be entered by a user into a single output expression input field 1001 provided by the GUI 217 (e.g., see the example GUI screen shot of FIG. 10). In this case, the user-drafted output expression specifies the function for calculation of signal phase in degrees on net 1, given signal propagation in the forward direction and in the transverse magnetic mode and further based on the results of a DC simulation. Alternatively, the output expression could be selected by a user from an index 1101, which lists all possible output expressions for all possible combinations of functions, nets, optical signal propagation directions, modes, and simulation types, and which is displayed by the GUI 217 (e.g., see the example GUI screen shot of FIG. 11). Alternatively, the output expression could be selected by a user given a set of drop-down menus 1201-1205 for each output expression component (i.e., function, net, optical signal propagation direction, mode, and simulation type) displayed by the GUI 217 (e.g., see the example GUI screen shot of FIG. 12). Alternatively, the output expression could be selected by a user from a displayed drop-down window 1301 following activation of a net-specific hyperlink 1302 on a displayed circuit diagram 1305 (e.g., see the example GUI screen shot of FIG. 13). In this case, the drop-down window would only display possible output expressions for the specific net.

Virtual optical probing can further include calculating the specific optical signal parameter value for the specific net indicated by the output expression given the simulation results 245 (see process 906). Optical signal parameter values can be calculated by processor 250 executing the functions as set forth in the optical signal propagation simulation program 215. The following are examples of functions that could be integrated into the optical signal propagation simulation program 215 for calculating optical signal parameter values. The power in dBm could be calculated as: 10*log 10(((VT("/netName.ftere")2)+(VT("/netName.fteim")2))*1000). The power in mW could be calculated as: (((VT("/netName.ftere")2)+(VT("/netName.fteim")2))*1000). The signal phase in degrees could be calculated as: atan2((VT("/netName.fteim")**2)/(VT("/netName.ftere"))*(180/pi). The signal phase in radians could be calculated as: atan2((VT("/netName.fteim")**2)/(VT("/netName.ftere")).

Figure 14:
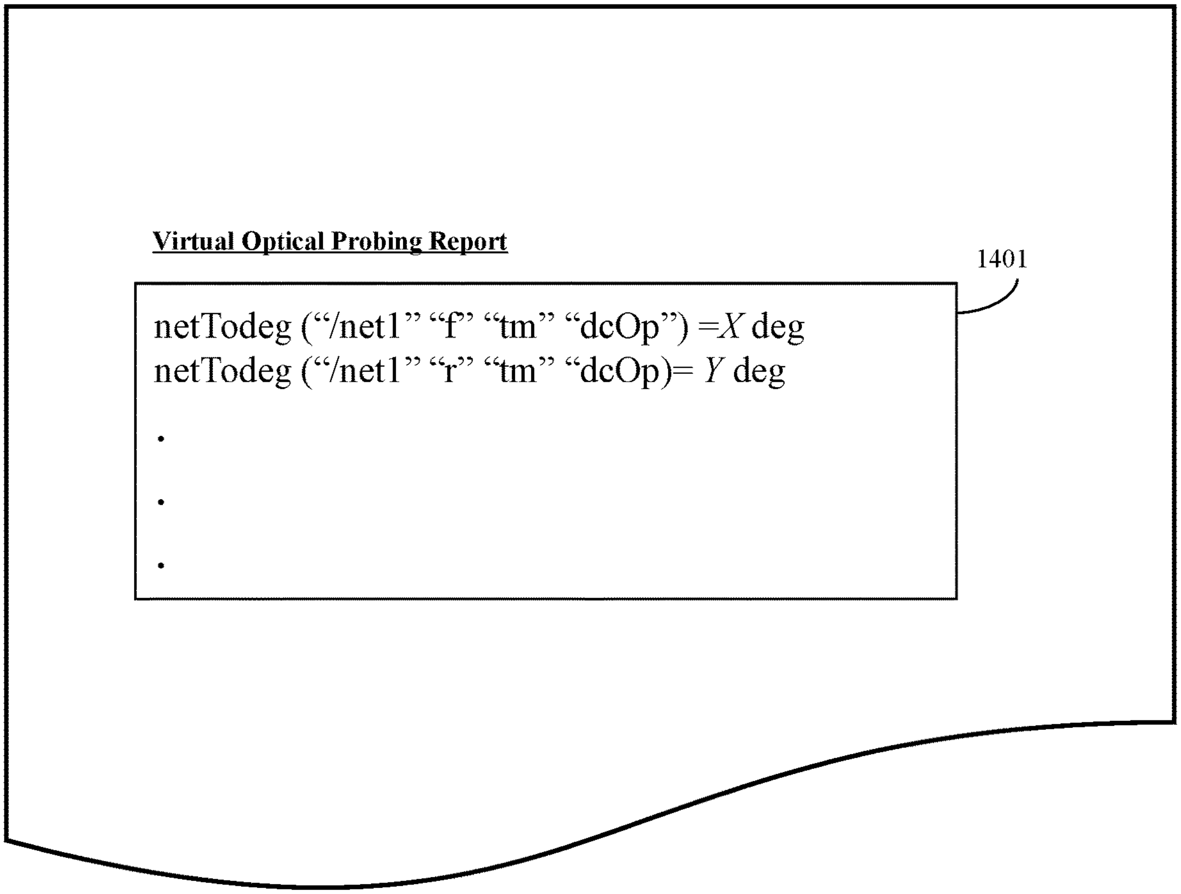
Figure 15:
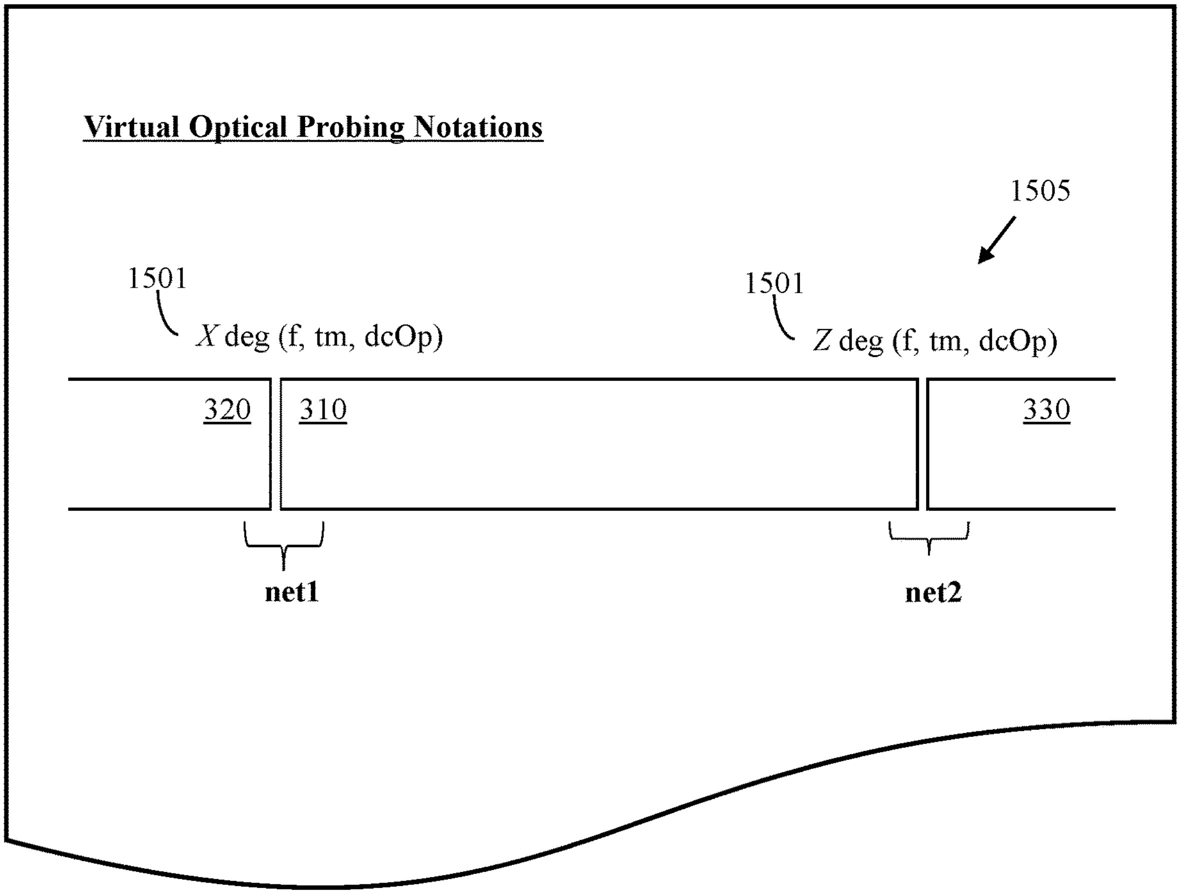

The specific optical signal parameter value can further be output to a user (see process 908). Optical signal parameter values calculated during virtual optical probing can be output by processor 250 via the GUI 217 of the optical signal propagation simulation program 215. For example, optical signal parameter values can be included in a virtual optical probing report 1401 (e.g., see the example GUI screen shot of FIG. 14). Alternatively, optical signal parameter values can be included, as notations 1501, in a depiction of at least a section of a schematic diagram 1505 of the photonic integrated circuit (e.g., see the example GUI screen shot of FIG. 15). It should be noted that such a depiction can be customizable (e.g., via settings) to enable different combinations of notations of optical parameter values to be displayed hereon. For example, as illustrated in FIG. 15, the parameter value shown for each net 1 and 2 is signal phase in degrees given forward signal propagation and the transverse magnetic mode and based on a DC simulation. To avoid clutter in the depiction, the number of optical signal parameter values displayed can be limited with setting options allowing a user to define the number of optical signal parameter values to be displayed and further allowing a user to set the specific optical signal parameter values to be displayed. Alternatively, optical signal parameter values can be output via GUI 217 in any other suitable format (e.g., graphs, tables, etc.) or output via any other suitable means for outputting simulation results.

Referring again to the flow diagram of FIG. 1, as with other post-layout simulation results, the results of virtual optical probing and, particularly, the specific optical signal parameter values calculated during virtual optical signal probing and output to a user can be evaluated (e.g., manually by the user, automatically by the processor, and/or by a combination of both automatic and manual evaluation processes). In any case, if these values indicate that one or of the performance specifications for the PIC have not been met, processes 104-110 can be iteratively repeated adjusting the design layout 241 until such performance specifications have been met and the final PIC design layout 243 can be released to tape-out at process 112.

Embodiments disclosed herein may be implemented as a system, a method, a computer program product and/or a PDK product. A computer program product may include a computer readable storage medium (or media) having, embodied therewith, any of the above-described PIC design programs including, but not limited to, the optical signal propagation simulation program and, particularly, program instructions thereof for causing a processor to carry out aspects of the disclosed embodiments. A PDK product may similarly include a computer readable storage medium (or media) having, embodied therewith, any of the above-described PIC design programs including, but not limited to, the optical signal propagation simulation program and, particularly, program instructions thereof for causing a processor to carry out aspects of the disclosed embodiments. As discussed in greater detail above, the computer readable storage medium (or media) of a PDK product can further have embodied therewith design data files (e.g., symbols and technology files for the specific technology node, design rule decks for various stages in the design process, etc.) that can be employed by EDA tools during PIC design to facilitate the PIC design process.

In any case, a computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the disclosed embodiments may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the disclosed embodiments.

Aspects of the disclosed embodiments are described herein with reference to flowchart illustrations and/or block diagrams of methods, apparatus (systems), and computer program products according to disclosed embodiments. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various disclosed embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 16:
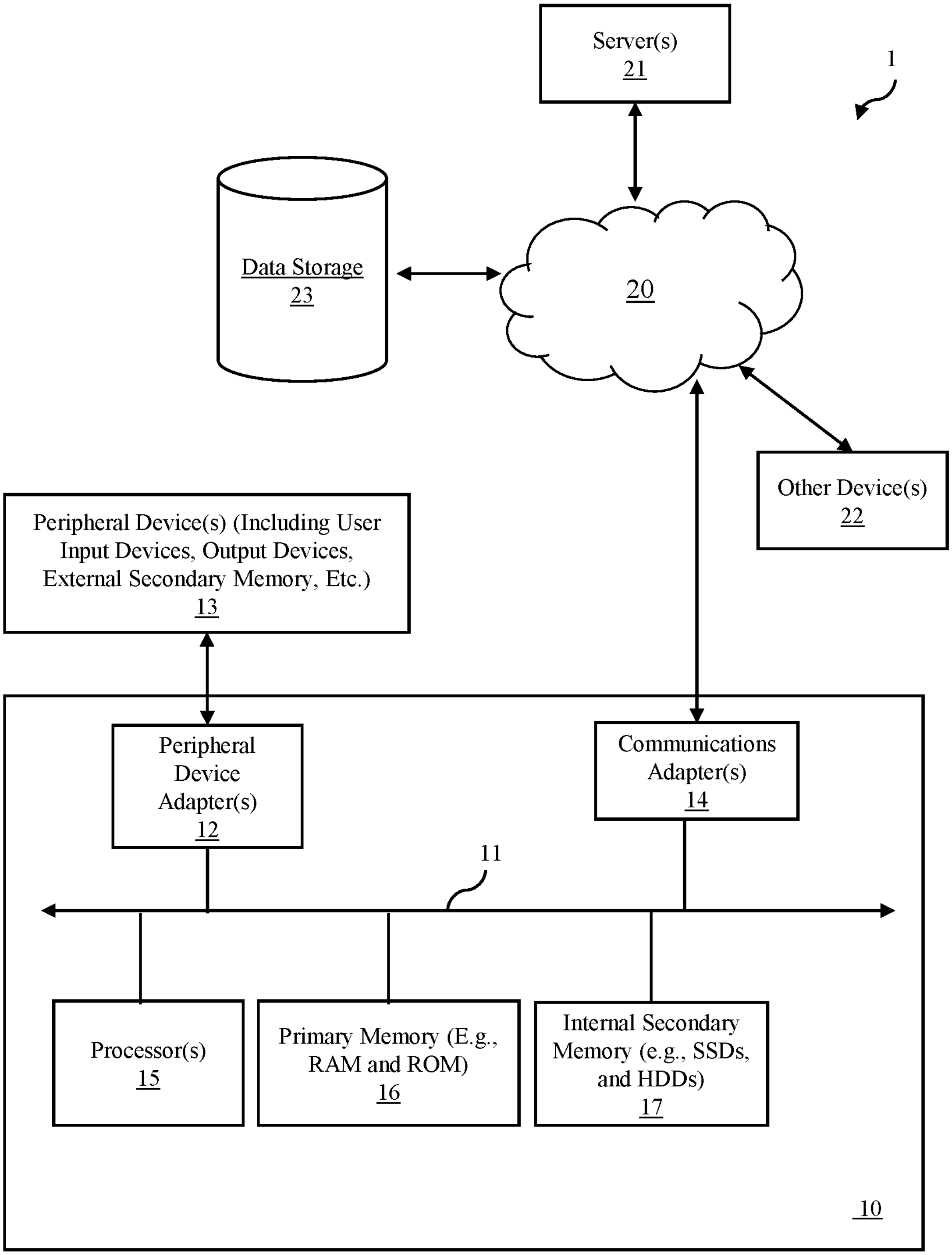
FIG. 16 is a schematic diagram illustrating an example hardware environment for implementing aspects of the disclosed systems, methods, and computer program or PDK products.

An illustrative hardware environment 1 for implementing aspects of the disclosed systems, methods and computer program products is depicted in FIG. 16. Generally, the hardware environment can include at least one computing device 10 (also referred to herein as a computer). Computer 10 can be, for example, a desktop, laptop, tablet, mobile computing device, etc. Computer 10 can include at least one bus 11. Bus 11 can be connected to various other components of the computer 10 and can be configured to facilitate communication between those components.

The computer 10 can include various adapters. The adapters can include one or more peripheral device adapters 12, which are configured to facilitate communications between one or more peripheral devices 13, respectively, and the bus 11. Peripheral devices 13 can include user input devices configured to receive user inputs. User input devices can include, but are not limited to, a keyboard, a mouse, a microphone, a touchpad, a touchscreen, a stylus, biosensor, a scanner, or any other type of user input device. Peripheral devices 13 can also include additional input devices, such as external secondary memory devices (as discussed in greater detail below). The peripheral devices 13 can also include output devices. The output devices can include, but are not limited to, a printer, a monitor, a speaker, or any other type of computer output device. The adapters can include one or more communications adapters 14 (also referred to herein as a computer network adapters), which are configured to facilitate communications between the computer 10 and one or more communications networks 20 (e.g., a wide area network (WAN), a local area network (LAN), the internet, a cellular network, a Wi-Fi network, etc.). Such network(s) 20 can, in turn, facilitate communications between the computer 10 and other system components on the network: remote server(s) 21, other device(s) 22 (e.g., computers, laptops, tablets, mobile phones, etc.), remote data storage 23, etc.

The computer 10 can further include at least one processor 15 (also referred to herein as a central processing unit (CPU)). Optionally, each CPU 15 can include a CPU cache. Each CPU 15 can be configured to read and execute program instructions.

The computer 10 can further include memory and, particularly, computer-readable storage mediums. The memory can include primary memory 16 and secondary memory. The primary memory 16 can include, but is not limited to, random access memory (RAM) (e.g., volatile memory employed during execution of program operations) and read only memory (ROM) (e.g., non-volatile memory employed during start-up). The RAM can include, but is not limited to, dynamic random access memory (DRAM), static random access memory (SRAM), or any other suitable type of RAM. The ROM can include, but is not limited to, erasable programmable read only memory (EPROM), flash memory, electronically erasable programmable read only memory (EEPROM), programmable read only memory (PROM), or any other suitable type of ROM. The secondary memory can be non-volatile. The secondary memory can include internal secondary memory 17, such as internal solid state drive(s) (SSD(s)) and/or internal hard disk drive(s) (HDD(s), installed within the computer 10 and connected to the bus 11. The secondary memory can also include external secondary memory connected to or otherwise in communication with the computer 10 (e.g., peripheral devices). The external secondary memory can include, for example, external/portable SSD(s), external/portable HDD(s), flash drive(s), thumb drives, compact disc(s) (CD(s)), digital video disc(s) (DVD(s)), network-attached storage (NAS), storage area network (SAN), or any other suitable non-transitory computer-readable storage media connected to or otherwise in communication with the computer 10. The different functions of primary and secondary memory are well known in the art and, thus, the details thereof have been omitted from this specification in order to allow the reader to focus on the salient aspects of the disclosed embodiments.

In some embodiments, program instructions for performing the disclosed method or a portion thereof, as described above, can be embodied in (e.g., stored in) secondary memory accessible by computer 10. When the program instructions are to be executed (e.g., in response to user inputs to the computer 10), required information (e.g., the program instructions and other data) can be loaded into the primary memory (e.g., stored in RAM). The CPU 15 can read the program instructions and other data from the RAM and can execute the program instructions. In other embodiments, a client-server model can be employed. In this case, the computer 10 can be a client and a remote server 21 in communication with the computer 10 over a network 20 can provide, to the client, a service including execution of program instructions for performing the disclosed method or a portion thereof, as described above, in response to user inputs the computer 10.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system including:

an interface device receiving an output expression, wherein the output expression at least specifies a virtual optical probing function of multiple virtual optical probing functions and a net in a netlist for a photonic integrated circuit; and a processor in communication with the interface device, wherein, in response to the output expression, the processor accesses a storage medium storing the netlist and results of at least one simulation of the photonic integrated circuit and executes the virtual optical probing function to calculate and output an optical signal parameter value for the net based on the results.

2. The system of claim 1, wherein, within the output expression, the virtual optical probing function is defined as one of a function for calculation of power in decibel-milliwatts of an optical signal on the net, a function for calculation of power in milliwatts of the optical signal on the net, a function for calculation of amplitude in volts/meter of the optical signal on the net, a function for calculation of signal phase in degrees of the optical signal on the net, and a function for calculation of signal phase in radians of the optical signal on the net.

3. The system of claim 1, wherein the output expression further defines an optical signal mode and a simulation type, and wherein, within the output expression, the optical signal mode is defined as one of a transverse electric mode and a transverse magnetic mode and the simulation type is defined as one of a direct current simulation and a transient simulation.

4. The system of claim 1, wherein the interface device comprises a monitor displaying a graphic user interface, wherein the output expression is received through the graphic user interface, and wherein the output expression is as any one of:

user-drafted;

user-selected from a displayed index listing all output expressions;

user-selected from displayed drop-down windows for each output expression component; and user-selected from a displayed drop-down window following activation of a net-specific hyperlink on a displayed circuit diagram.

5. The system of claim 1, wherein the interface device comprises a monitor displaying a graphic user interface including a depiction of at least a section of a schematic diagram of the photonic integrated circuit, and wherein the optical signal parameter value is output as a notation on the depiction.

6. The system of claim 5, wherein the depiction is customizable to enable different combinations of notations of optical parameter values thereon.

7. The system of claim 1, wherein the processor further performs the at least one simulation of the photonic integrated circuit and stores the results, wherein the at least one simulation includes forward and reverse signal propagation simulation.

8. The system of claim 7, wherein the output expression further indicates a signal propagation direction, and, within the output expression, the signal propagation direction is defined as one of forward signal propagation and reverse signal propagation.

9. The system of claim 7, wherein storage medium further stores a process design kit including a library of cells and a simulation program, wherein the library of cells includes photonic device cells selectable for inclusion in the design, wherein each photonic device cell includes a component description defining ten pins at each terminal that emits or receives light signals with five of the ten pins being associated with components of forward signal propagation and five of the ten pins being associated with components of reverse signal propagation, and wherein the simulation program is executable by the processor to perform the forward and reverse signal propagation simulation using the ten pins.

10. The system of claim 7, wherein the net is between two photonic device cells including a light emitting device and a light receiving device, wherein the light emitting device has ten output pins and the light receiving device has ten input pins, and wherein the ten output pins are paired with the ten input pins and include:

a pair of pins for transverse electric mode and real component of the forward signal propagation;

a pair of pins for transverse electric mode and imaginary component of the forward signal propagation;

a pair of pins for transverse magnetic mode and real component of the forward signal propagation;

a pair of pins for transverse magnetic mode and imaginary component of the forward signal propagation; and a pair of pins for wavelength of the forward signal propagation;

a pair of pins for transverse electric mode and real component of the reverse signal propagation;

a pair of pins for transverse electric mode and imaginary component of the reverse signal propagation;

a pair of pins for transverse magnetic mode and real component of the reverse signal propagation;

a pair of pins for transverse magnetic mode and imaginary component of the reverse signal propagation; and a pair of pins for wavelength of the reverse signal propagation.

11. A method comprising:

receiving, by an interface device of a system, an output expression, wherein the output expression at least specifies a virtual optical probing function of multiple virtual optical probing functions and a net in a netlist for a photonic integrated circuit; and accessing, by a processor of the system in response to the output expression, a storage medium that stores the netlist and results of at least one simulation of the photonic integrated circuit and executing, by the processor, the virtual optical probing function to calculate and output an optical signal parameter value for the net based on the results.

12. The method of claim 11, wherein, within the output expression, the virtual optical probing function is defined as one of a function for calculation of power in decibel-milliwatts of an optical signal on the net, a function for calculation of power in milliwatts of the optical signal on the net, a function for calculation of amplitude in volts/meter of the optical signal on the net, a function for calculation of signal phase in degrees of the optical signal on the net, and a function for calculation of signal phase in radians of the optical signal on the net.

13. The method of claim 11, wherein the output expression further defines an optical signal mode and a simulation type, and wherein, within the output expression, the optical signal mode is defined as one of a transverse electric mode and a transverse magnetic mode and the simulation type is defined as one of a direct current simulation and a transient simulation.

14. The method of claim 11, wherein the interface device comprises a monitor displaying a graphic user interface, wherein the output expression is received through the graphic user interface, and wherein the output expression is as any one of:

user-drafted;

user-selected from a displayed index listing all output expressions;

user-selected from displayed drop-down windows for each output expression component; and user-selected from a displayed drop-down window following activation of a net-specific hyperlink on a displayed circuit diagram.

15. The method of claim 11, wherein the interface device includes a monitor displaying a graphic user interface, and wherein the method further includes:

displaying, through the graphic user interface, a depiction of at least a section of a schematic diagram of the photonic integrated circuit; and outputting, through the graphic user interface, the optical signal parameter value as a notation on the depiction.

16. The method of claim 15, wherein the depiction is customizable to enable different combinations of notations of optical parameter values thereon.

17. The method of claim 11, further comprising performing, by the processor, the at least one simulation of the photonic integrated circuit and storing the results in the storage medium, wherein the at least one simulation includes any of a forward signal propagation simulation, a reverse signal propagation simulation, and a forward and reverse signal propagation simulation.

18. The method of claim 17, wherein the output expression further indicates a signal propagation direction, and, within the output expression, the signal propagation direction is defined as one of forward signal propagation and reverse signal propagation.

19. The method of claim 17, wherein the storage medium stores a process design kit including a library of cells and a simulation program, wherein the library of cells includes photonic device cells selectable for inclusion in the design, wherein each photonic device cell includes a component description defining ten pins at each terminal that emits or receives light signals with five of the ten pins being associated with components of forward signal propagation and five of the ten pins being associated with components of reverse signal propagation, wherein the simulation program is executable by the processor to perform the forward signal propagation simulation and the reverse signal propagation simulation using the ten pins, wherein the net is between two photonic device cells including a light emitting device and a light receiving device, wherein the light emitting device has ten output pins and the light receiving device has ten input pins, and wherein the ten output pins are paired with the ten input pins and include:

a pair of pins for transverse electric mode and real component of the forward signal propagation;

a pair of pins for transverse electric mode and imaginary component of the forward signal propagation;

a pair of pins for transverse magnetic mode and real component of the forward signal propagation;

a pair of pins for transverse magnetic mode and imaginary component of the forward signal propagation; and a pair of pins for wavelength of the forward signal propagation;

a pair of pins for transverse electric mode and real component of the reverse signal propagation;

a pair of pins for transverse electric mode and imaginary component of the reverse signal propagation;

a pair of pins for transverse magnetic mode and real component of the reverse signal propagation;

a pair of pins for transverse magnetic mode and imaginary component of the reverse signal propagation; and a pair of pins for wavelength of the reverse signal propagation.

20. A product comprising a computer readable storage medium having program instructions embodied therewith, the program instructions being executable by a processor to cause the processor to perform a method including:

receiving an output expression that at least specifies a virtual optical probing function of multiple virtual optical probing functions and a net in a netlist for a photonic integrated circuit; and in response to the output expression, accessing a storage medium storing the netlist and results of at least one simulation of the photonic integrated circuit and executing the virtual optical probing function to calculate and output an optical signal parameter value for the net based on the results.

* * * * *